United States Patent [19]
Sugii et al.

[11] Patent Number: 5,514,842
[45] Date of Patent: May 7, 1996

[54] KEYBOARD CIRCUIT APPARATUS

[75] Inventors: Takeshi Sugii; Yoshiaki Ohashi, both of Kawasaki, Japan

[73] Assignee: Fujitsu Limited, Kawasaki, Japan

[21] Appl. No.: 201,235

[22] Filed: Feb. 24, 1994

[30] Foreign Application Priority Data

Mar. 18, 1993 [JP] Japan .................................. 5-059131

[51] Int. Cl.⁶ .......................... H01H 1/58; H01H 13/70
[52] U.S. Cl. ............... 200/5 A; 200/512; 341/22
[58] Field of Search ............... 200/5 A, 511–517; 341/22–27

[56] References Cited

U.S. PATENT DOCUMENTS 3,720,938  3/1973  LePosauic ..................... 340/365 S
4,518,833  5/1985  Watkins ........................... 200/5 A
4,994,634  2/1991  Tanji et al. ....................... 200/5 A
5,081,453  1/1992  Endoh et al. ................. 340/825.79

FOREIGN PATENT DOCUMENTS 4-47934  8/1992  Japan ........................ H01H 13/76

Primary Examiner—Kristine L. Kincaid
Assistant Examiner—Michael A. Friedhofer
Attorney, Agent, or Firm—Staas & Halsey

[57] ABSTRACT

A keyboard circuit apparatus is constituted such that resistive elements are provided both in a first sheet and a second sheet, an insulating spacer being laid on the first sheet, and the second sheet being laid on the insulating spacer. When a key switch is closed, one of the resistive elements provided on the first sheet and one of the resistive elements provided on the second sheet are electrically connected in series so that a desired value of resistance can be obtained.

32 Claims, 15 Drawing Sheets

$P_1 = 1$ mm
$P_2 = 1$ mm $P_1 = 1\text{mm}$
$P_2 = 1\text{mm}$

VALUE OF RESISTANCE

MEAN VALUE OF RESISTANCE

KEYBOARD CIRCUIT APPARATUS

BACKGROUND OF THE INVENTION

The present invention relates to keyboard circuit apparatuses, and more particularly to a keyboard circuit apparatus of a membrane-switch type which uses a wiring matrix to perform key scan operation, and which is constituted such that so-called sneak current is detected by means of a resistance matrix.

For the sake of clarifying the background of the invention, the constitution which uses a resistance matrix for the purpose of detecting sneak current will be explained first.

The phenomenon of sneak current is characteristic of key scan operation. Referring to FIG. 1 showing the principle of a keyboard circuit apparatus disclosed in the Japanese Patent Publication 4-47934, a sneak current i flows when keys B, C and D are pressed at the same time, resulting in the closure of a key A being erroneously detected unless no preventive measure is taken.

A keyboard apparatus 10 in FIG. 1 includes a keyboard circuit apparatus 11 and a key closure detection unit 12.

The keyboard circuit apparatus 11 includes X lines (hereinafter, referred to as detection lines) 13, Y lines (hereinafter, referred to as ground scan lines) 14 crossed by the detection lines, key switches 15-1–15-4 and resistive elements 16-1–16-4. Generally, the key switches of the keyboard circuit apparatus 11 are membrane switches.

The key closure detection unit 12 includes: a scan unit 17 for sequentially scanning the ground scan lines 14 so that the ground scan lines 14 are set at the ground potential one at a time; an analog multiplexor 18 for sequentially selecting as input each of the plurality of detection lines 13; and a comparator 19 for comparing the output voltage of the analog multiplexor 18 with a reference voltage Vref.

An intermediate-level voltage $Z_V$ is applied to the detection lines 13. The level of $Z_V$ is such that $0V < Vref < Z_V < 5V$.

The detection line 13 that is selected by the analog multiplexor 18 is turned into an open circuit, while all the other detection lines 13 are connected to the voltage source providing $Z_V$.

When the key A is pressed in a normal manner, the key switch 15-1 is closed as shown in FIG. 2A, with the result that the voltage V of the line 20 is substantially zero. Since V<Vref in this case, the comparator outputs a signal.

When the keys B, C and D are pressed at the same time, the key switches 15-2, 15-3 and 15-4 are closed, as shown in FIG. 1 and FIG. 2B.

In this case, the sneak current i flows as indicated in FIG. 1. Thus, the voltage V of the line 20 is not lower than $Z_V$. It will be noted that V>Vref because Vref<$Z_V$. The comparator 19 does not output a signal.

In this way, the erroneous detection of the closure of the key A when the keys B, C and D are pressed at the same time is prevented.

In order that the detection of the sneak current be performed properly as described above, the value of resistance of the resistive elements 16-1– 16-4 needs to be precisely controlled.

FIGS. 3 and 4 show a keyboard circuit apparatus 30 which is an embodiment disclosed in the Japanese Laid-Open Patent Application 4-47934, FIG. 3 being a perspective view and FIG. 4 being a cross sectional view. FIG. 5 shows a part of the circuit configuration used in the keyboard circuit apparatus 30 of FIG. 3.

The keyboard circuit apparatus 30 is constituted such that a first sheet 31 is laid under a second sheet 32, an insulating spacer 33 intervening between the two sheets.

The first sheet 31 is formed with detection lines 34, fixed contacts 35 and resistive elements 36.

The second sheet 32 is formed with ground scan lines 37 and movable contacts 38.

The resistive elements 36 are formed by printing carbon in zigzag patterns using a screen printing machine.

Since the resistive elements 36 are formed only on the first sheet 31, there is a problem in that, if the first sheet 31 is defectively produced such that the value of resistance of any of the resistive elements 36 is below or above the allowed value due to variations in the printing process, there is no way of redressing the defect, and the defectively produced first sheet 31 has no use but to be discarded as waste.

The cost of the having to discard defective first sheets 31 adds to the cost of the keyboard circuit apparatus 30, resulting in a relatively high cost of the keyboard circuit apparatus 30.

Another reason for poor yield of the first sheet 31 is that the value of resistance of the resistive elements 36 tends to vary, if the resistive elements 36 are formed in zigzag patterns which may encourage the printed resistive material to seep out from the target area.

SUMMARY OF THE INVENTION

Accordingly, the object of the present invention is to provide a keyboard circuit apparatus in which produced sheets are not wasted, and the manufacturing cost is reduced.

The above object can be achieved by a keyboard circuit apparatus which includes:

a first sheet produced such that a plurality of detection lines, first resistive elements connected to the respective detection lines and first contacts provided at the ends of the respective first resistive elements are printed on a first sheet main body;

a second sheet produced such that a plurality of ground scan lines, a plurality of second resistive elements connected to the respective ground scan lines and second contacts provided at the ends of the respective second resistive elements are printed on a second sheet main body; and an insulating spacer having a plurality of openings, wherein the insulating spacer is laid on the first sheet and the second sheet is laid on the insulating spacer so that the first contacts and the second contacts are directly opposite each other respectively at the openings, and the first resistive elements and the second resistive elements are electrically connected in series when the first contacts and the second contacts are brought into contact with each other respectively.

The aforementioned object of the present invention can also be achieved by a keyboard circuit apparatus, wherein the plurality of first resistive elements and/or the plurality of second resistive elements are formed in straight patterns lying in the same direction.

The aforementioned object of the present invention can also be achieved by a keyboard circuit apparatus, wherein the plurality of first resistive elements and/or the plurality of second resistive elements are formed in S-shaped patterns lying in the same direction.

The aforementioned object of the present invention can also be achieved by a keyboard circuit apparatus, wherein the plurality of first resistive elements are formed in two types of straight patterns, i.e. patterns inclined 45° clockwise with respect to the direction of printing, and patterns inclined 45° counterclockwise with respect to the direction of printing, and/or the plurality of second resistive elements are formed in two types of straight patterns, i.e. patterns inclined 45° clockwise with respect to the direction of printing, and patterns inclined 45° counterclockwise with respect to the direction of printing.

The aforementioned object of the present invention can also be achieved by a keyboard circuit apparatus, wherein the detection lines, the first contacts, the ground scan lines and the second contacts are printed in bare patterns formed of blended silver-carbon paste containing polyester binder capable of inducing partial crosslinks after the paste has dried, or of carbon paste containing such a binder.

A constitution of the invention, wherein both the first sheet and the second sheet have resistive elements, and any of the first resistive elements on the first sheet and the corresponding one of the second resistive elements on the second sheet are respectively connected in series when the switch is closed, functions such that different combinations of first and second sheets may be selected to produce desired results.

A constitution of the invention, wherein the resistive elements are formed in straight patterns lying in the same direction, functions such that the resistive material printed by screen printing seeps out from a target area to a smaller degree than in the conventional technology so that the variation in the value of resistance is small.

A constitution of the invention, wherein the resistive elements are formed in substantially S-shaped patterns lying in the same direction, functions such that resistive material printed by screen printing seeps out from a target area to a smaller degree than in the conventional technology so that the variation in the value of resistance is small.

A constitution of the invention, wherein the resistive elements are straight patterns lying either in the direction inclined 45° clockwise with respect to the printing direction or in the direction inclined 45° counterclockwise with respect to the printing direction, functions such that resistive material printed by screen printing seeps out from a target area to a smaller degree than in the conventional technology so that the variation in the value of resistance is small.

The polyester binder functions such that lines (detection lines and ground scan lines) formed of blended Ag and C paste or C paste are less likely to undergo discoloration or migration, and such that a carbon overcoat is not necessary. A constitution whereby the carbon overcoat is unnecessary functions such that the interval between the lines can be made smaller due to added space that is conventionally occupied by the carbon overcoat protruding from the lines.

Other objects and further features of the present invention will be apparent from the following detailed description, when read in conjunction with the accompanying drawings.

DESCRIPTION OF THE PREFERRED EMBODIMENTS

Figure 1:
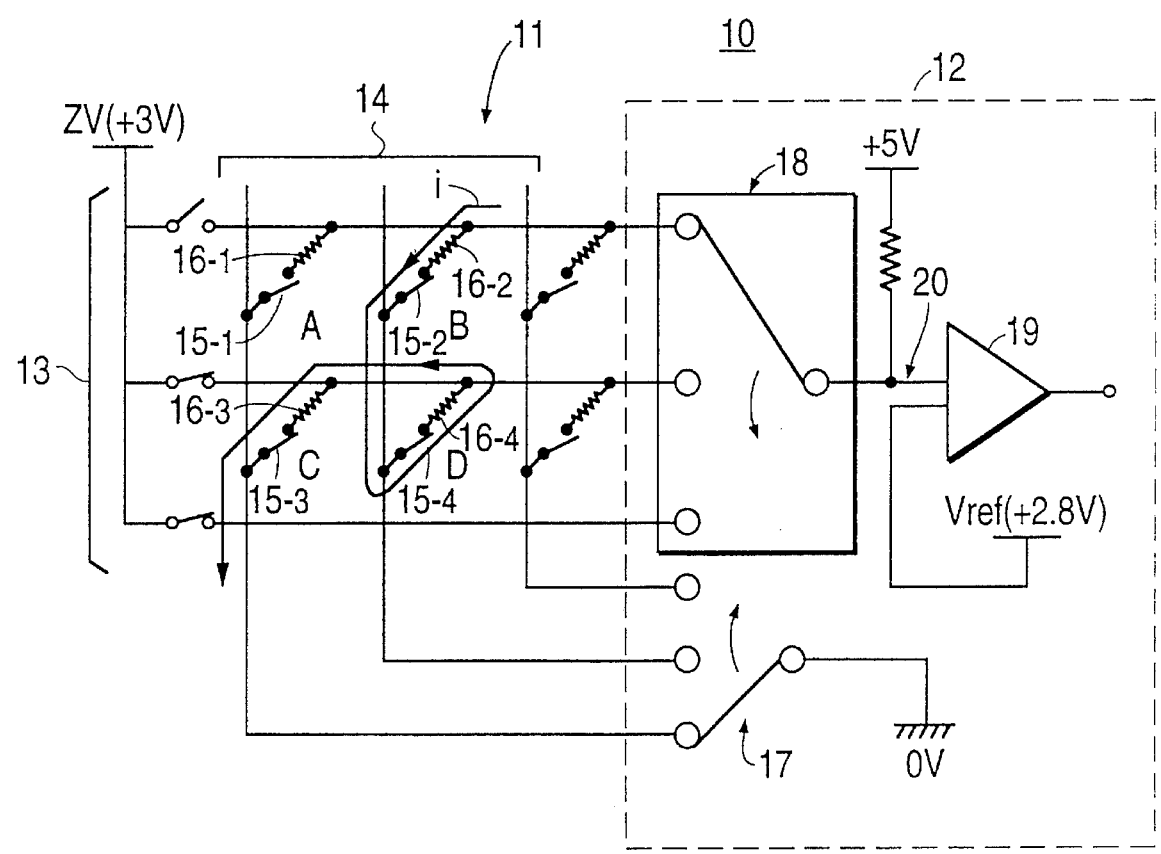
FIG. 1 shows a keyboard apparatus equipped with the function of detecting sneak current.
Figure 2A:
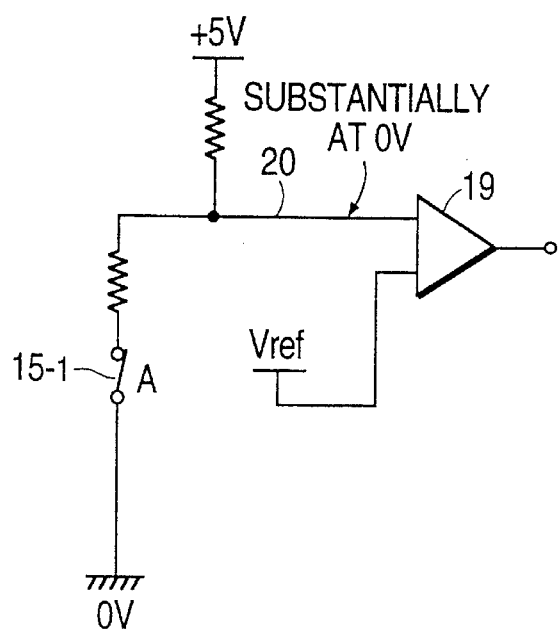
FIGS. 2A and 2B show how a sneak current is detected.
Figure 2B:
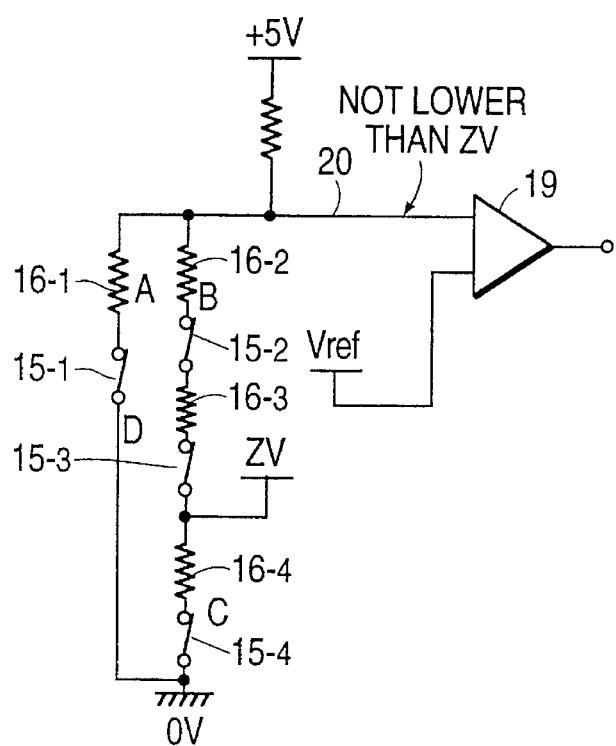
Figure 3:
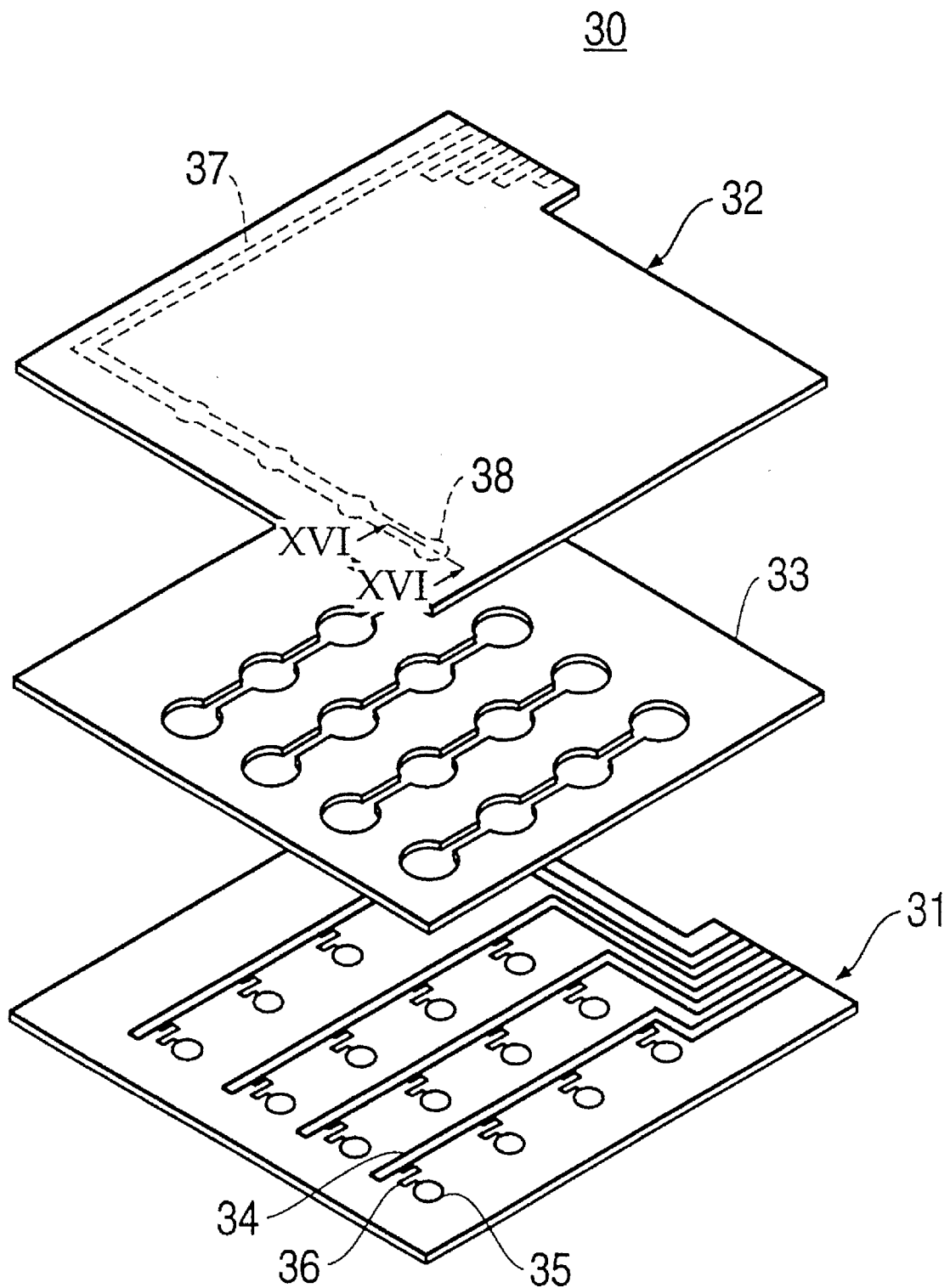
FIG. 3 is an exploded perspective view of a conventional keyboard circuit apparatus.
Figure 4:
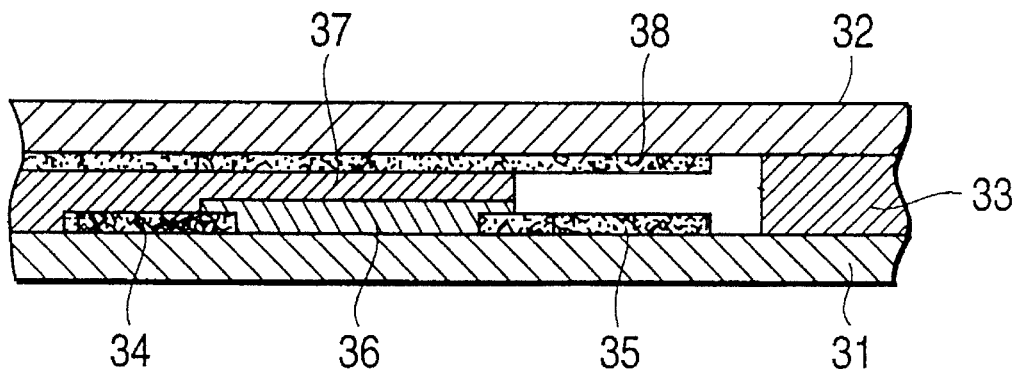
FIG. 4 is a cross sectional view taken along the line XVII—XVII of FIG. 3 and showing one of key switches of FIG. 3.
Figure 5:
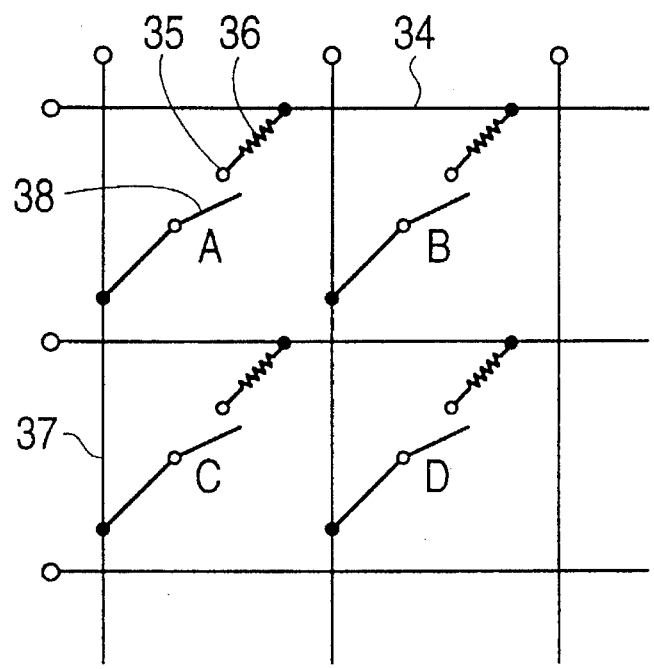
FIG. 5 is a part of the circuit diagram of the keyboard circuit apparatus of FIG. 3.
Figure 6:
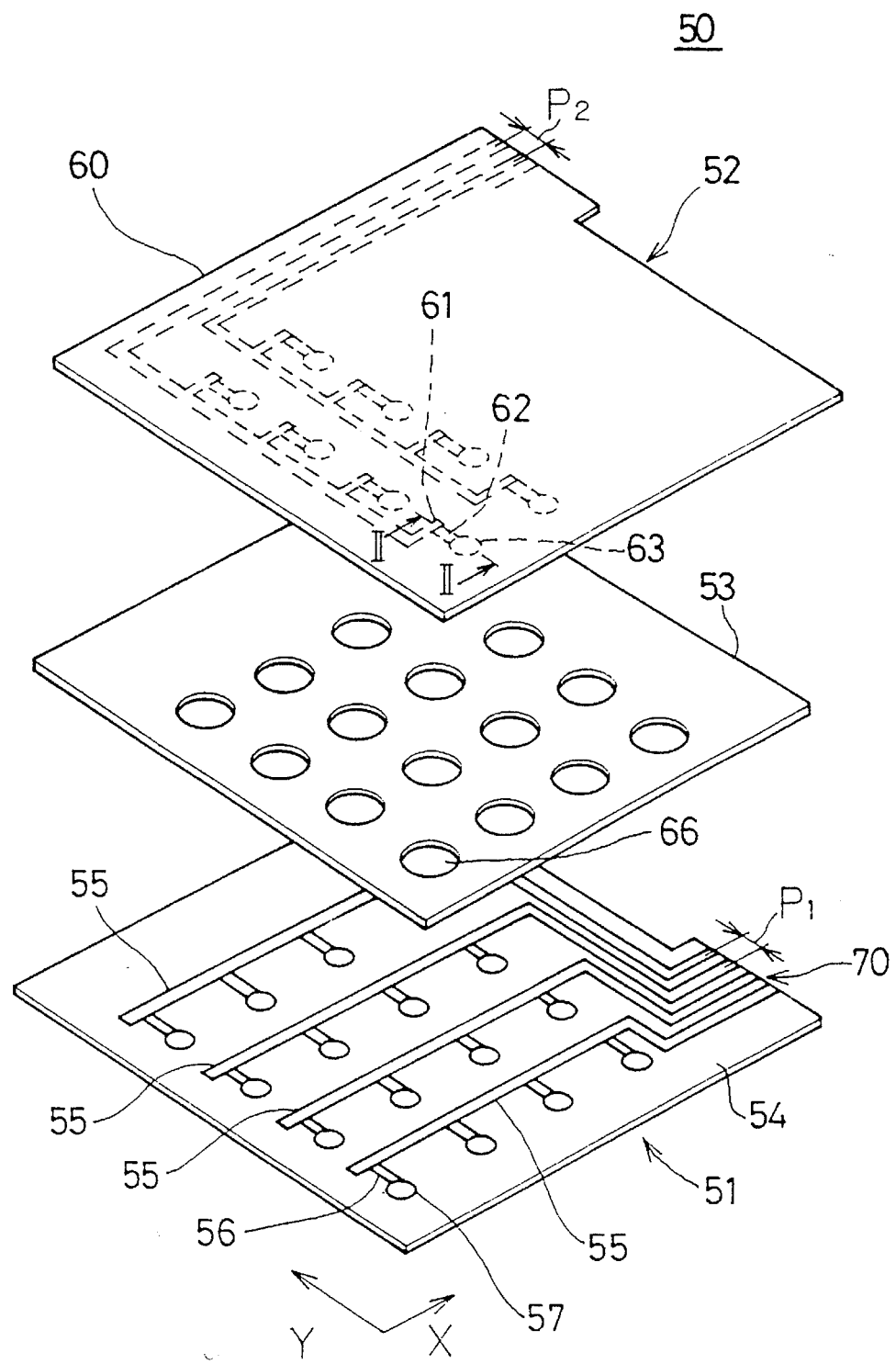
FIG. 6 is an exploded perspective view of a first embodiment of the keyboard circuit apparatus of the present invention.
Figure 7:
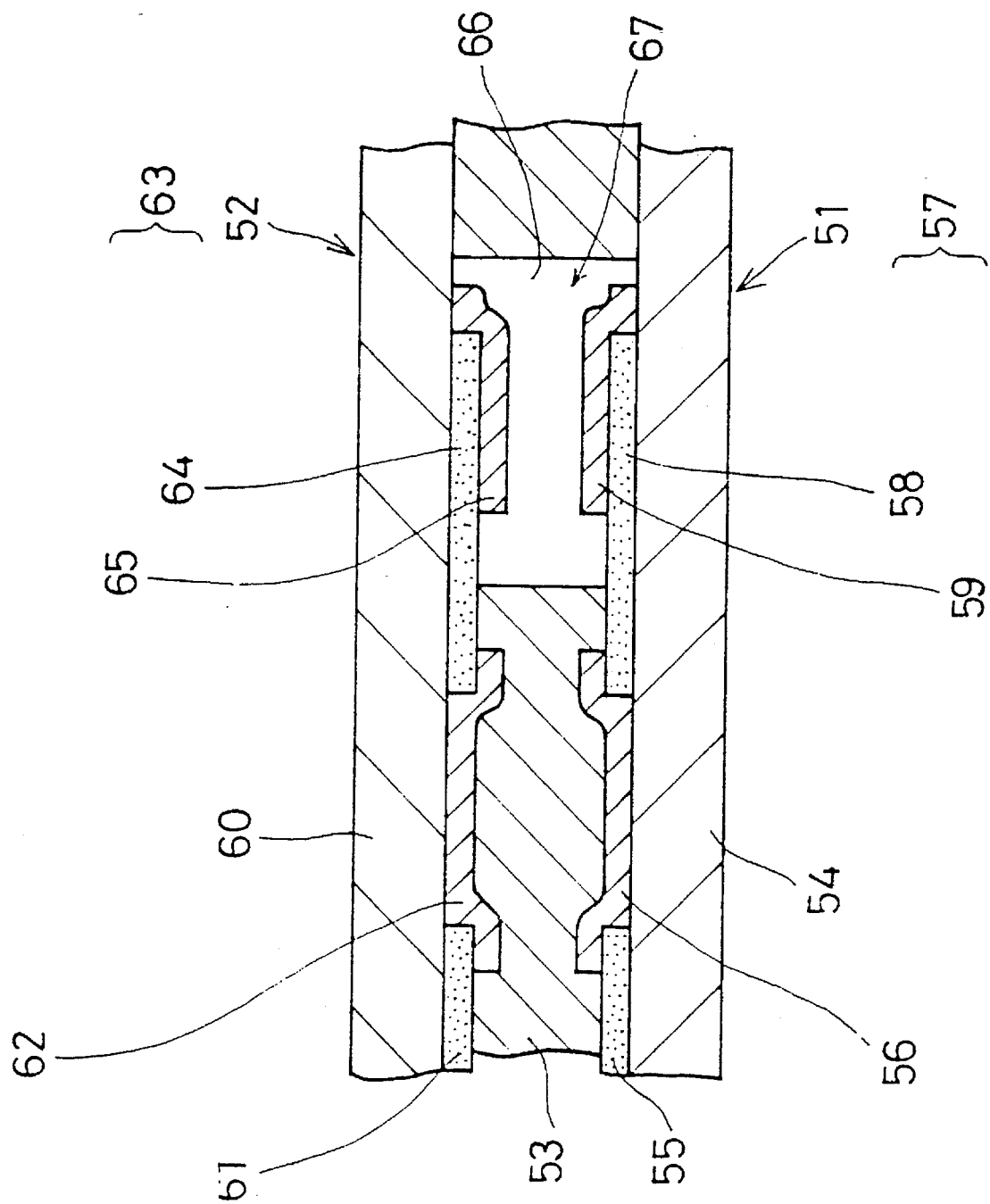
FIG. 7 is a cross sectional view taken along the line II—II of FIG. 6 and showing one of the key switches of FIG. 6.

FIGS. 6 and 7 show a keyboard circuit apparatus 50 according to a first embodiment of the present invention, constituted such that a first sheet 51 is laid under a second sheet 52, an insulating spacer 53 intervening between the two sheets.

Figure 8:
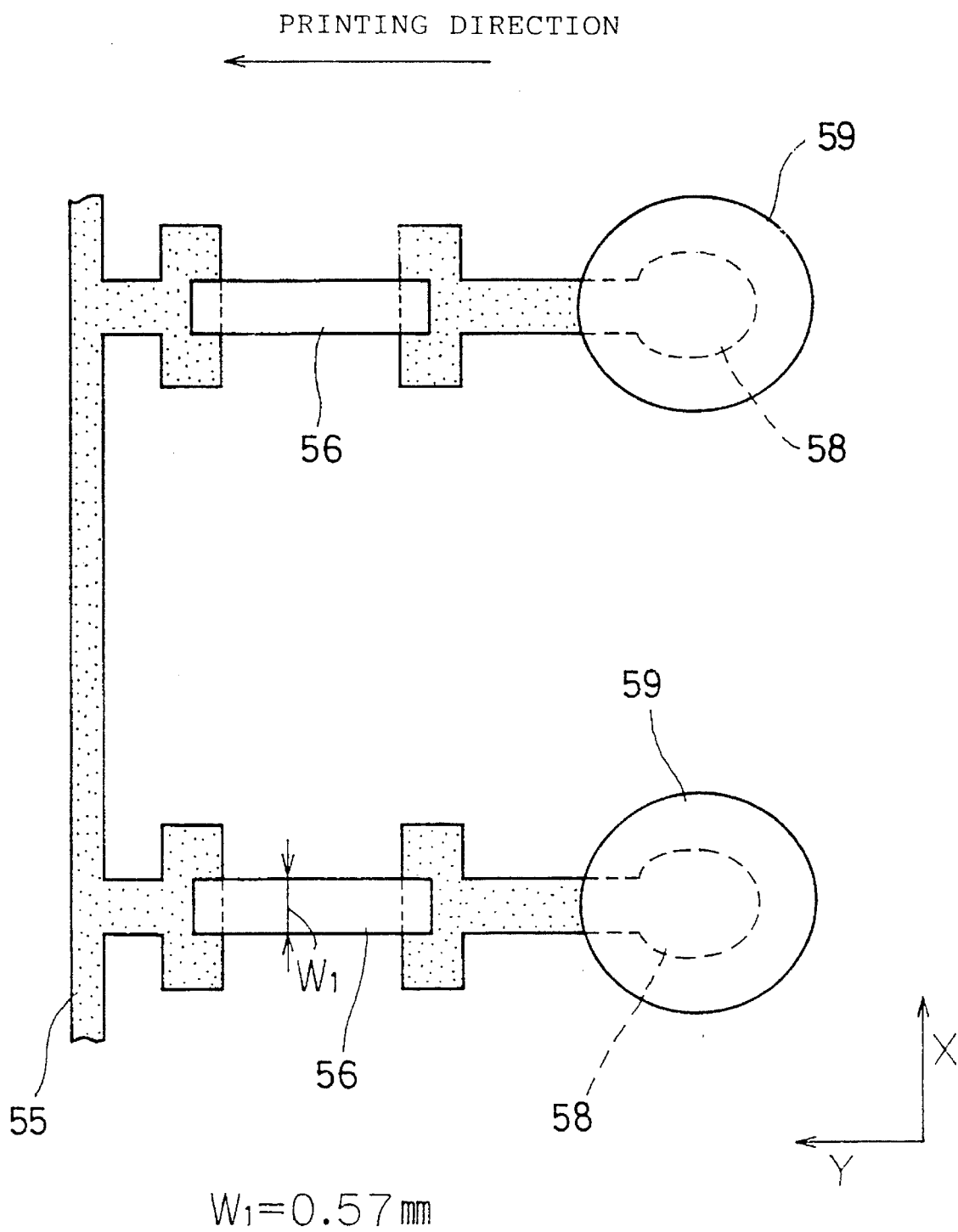
FIG. 8 shows a part of a pattern provided on a first insulating sheet on an enlarged scale.

As is also shown in FIG. 8, the first sheet 51 is configured such that a plurality of detection lines 55, first resistive elements 56 respectively connected to the detection lines 55 and fixed contacts 57 at the ends of the respective first resistive elements 56 are provided on the top surface of a polyethylene terephthalate (hereinafter, referred to as PET) sheet 54.

A contact 57 is comprised of a contact main body 58 and a carbon overcoat 59 coated on the contact main body 58. The detection line 55 and the contact main body 58 are printed in blended Ag and C paste. The first resistive element 56 and the overcoat 59 are printed in C paste.

The second sheet 52 is configured in substantially the same manner as the first sheet 51 such that a plurality of ground scan lines 61, second resistive elements 62 respectively connected to the ground scan lines 61 and movable contacts 63 at the ends of the respective second resistive elements 62 are provided on the bottom surface of a PET sheet 60.

As shown in FIG. 7, the contact 63 is comprised of a contact main body 64 and a cover 65 covering the contact main body 64.

The ground scan line 61 and the contact main body 64 are formed of Ag and C paste, while the second resistive element 62 and the cover 65 are formed of C paste.

Referring to FIG. 7, the movable contact 63 and the corresponding fixed contact 57 are opposite each other in close proximity at an opening 66 of the spacer 53, thus forming a membrane key switch 67.

The membrane key switch 67 is closed when the corresponding key is pressed.

Figure 9:
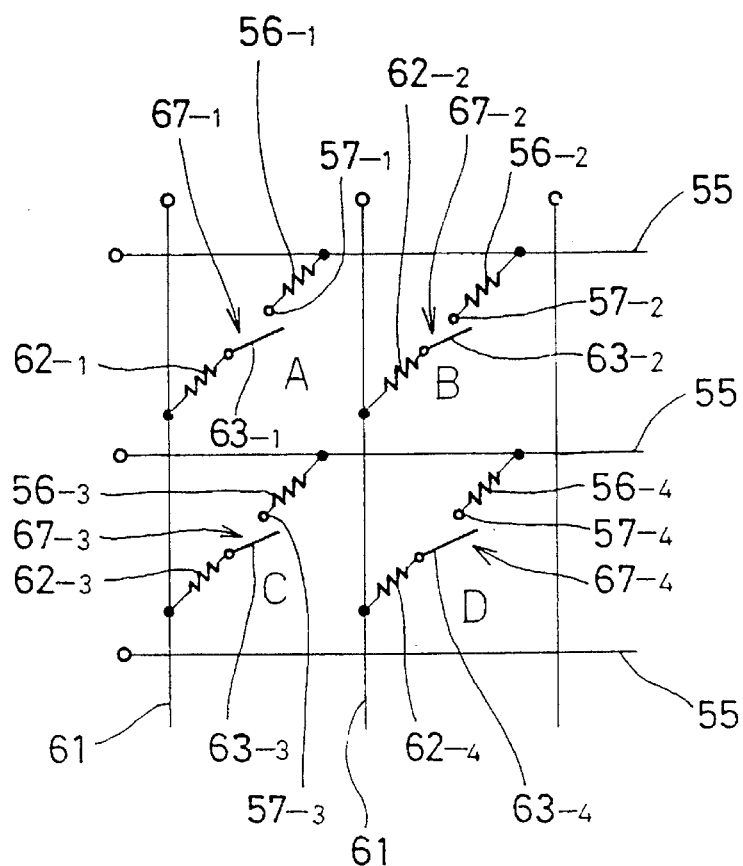
FIG. 9 is a part of the circuit diagram of the keyboard circuit apparatus of FIG. 6.

FIG. 9 shows a part of the circuit configuration used in the keyboard circuit apparatus 50.

Referring to FIG. 9, key switches 67-1–67-4 have respective fixed contacts 57-1–57-4 and respective movable contacts 63-1–63-4. First resistive elements 56-1–56-4 are provided between the respective fixed contacts 57-1–57-4 and the respective detection lines 55, and second resistive elements 62-1–62-4 are provided between the respective movable contacts 63 and the respective ground scan lines 61.

When any of the key switches 67-1–67-4 is closed, the corresponding one of the first resistive elements 56-1–56-4 and the corresponding one of the second resistive elements 62-1–62-4 are connected in series, resulting in a resistance having the value R being provided between the corresponding detection line and the corresponding ground scan line, $R_1$ being the sum of the value of the first resistive element and the value $R_2$ of the second resistive element.

The first sheet 51 is produced such that the detection lines 55 and the contact main bodies 58 are printed in blended Ag and C paste on the PET sheet 54 by screen printing. After the Ag and C paste has dried, the first resistive elements 56 and the overcoat 59 are printed in C paste by screen printing, and the C paste is allowed to dry.

All the first resistive elements 56 have a width $W_1$ (see FIG. 8) of 0.57 mm and lie in the Y direction indicated in FIG. 6.

The second sheet 52 is produced in substantially the same manner as the first sheet 51.

A description will now be given of the features of the keyboard circuit apparatus 50 described above.

(1) Reduction of number of discarded sheets

Figure 10A:
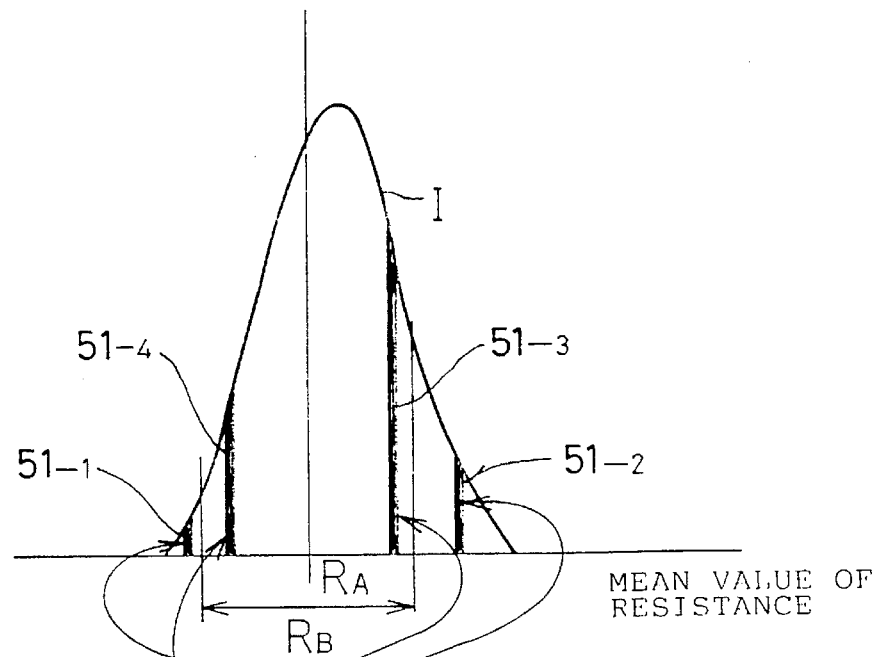
FIGS. 10A and 10B show how defectively produced first sheets or second sheets are put to use as acceptable products.

The line I in FIG. 10A indicates a typical distribution of mean values of resistance of the first resistive elements 56 provided in each lot of the first sheets 51, the lot containing the first sheet 51-1, the first sheet 51-2, the first sheet 51-3 and the first sheet 51-4. $R_A$ denotes the design value of resistance of the first resistive elements 56, and $R_B$ indicates the permitted range of the value of resistance of the first resistive elements 56.

Figure 10B:
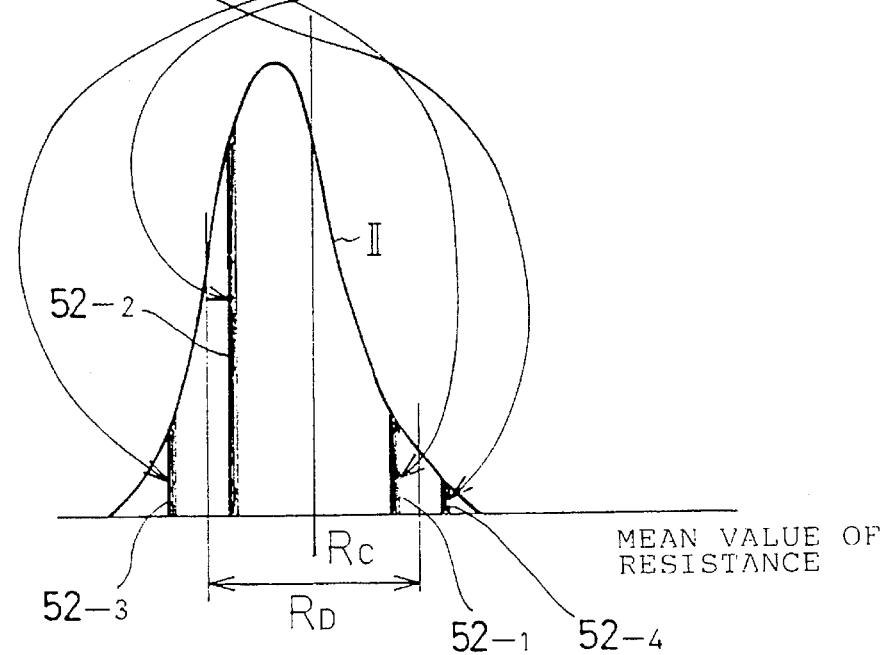

The line II in FIG. 10B indicates a typical distribution of mean values of resistance of the second resistive elements 62 provided in each lot of the second sheets 52, the lot containing the second sheet 52-1, the second sheet 52-2, the second sheet 52-3 and the second sheet 52-4. $R_C$ denotes the design value of resistance of the second resistive elements 62, and $R_D$ indicates the permitted range of the value of resistance of the second resistive elements 62.

It will be noted from FIGS. 10A and 10B that the first sheet 51-1 in which the mean value of resistance of the first resistive elements 56 is below the lower limit of the permitted range $R_B$ can be used in combination with the second sheet 52-1 in which the mean value of resistance of the second resistive elements 62 is relatively high.

In such a combination, the value of resistance derived from the series connection of the first resistive element 56 with the second resistive element 62 will fit within the permitted range.

Conventionally, the plurality of first sheets 51-1 from the lots having the distribution as shown in FIG. 10A have been discarded as defective products. However, by using the above-mentioned combination technique, such first sheets 51-1 can be put to use as acceptable products.

Similarly, the first sheet 51-2 in which the mean value of resistance of the first resistive elements 56 is above the upper limit of permitted range $R_B$ can be used in combination with the second sheet 52-2 in which the mean value of resistance of the second resistive elements 62 is relatively low.

Further, the second sheet 52-3 in which the mean value of resistance of the resistive elements 62 is below the lower limit of the permitted range $R_D$ can be used in combination with the first sheet 51-3 in which the mean value of resistance of the first resistive elements 56 is relatively high.

Still further, the second sheet 52-4 in which the mean value of resistance of the resistive elements 62 is above the upper limit of the permitted range $R_D$ can be used in combination with the first sheet 51-4 in which the mean value of resistance of the first resistive elements 56 is relatively low.

In this way, the yield of the first sheets 51 and the second sheets 52 is improved to be about 95% in contrast to the conventional 85%, thus reducing the manufacturing cost of the keyboard circuit apparatus 50.

(2) Improvement in the precision of the value of resistance of the first and second resistive elements 56 and 62.

It is to be noted that the first resistive elements 56 and the second resistive elements 62 are formed in straight patterns and not in zigzag patterns, as shown in FIGS. 6 and 8.

The first resistive elements 56 and the second resistive elements 62 have a width $W_1$ of 0.57 mm, which is greater than in the conventional technology.

All the first resistive elements 56 have the length thereof aligned with the Y direction, and the screen printing thereof is performed in the Y direction.

The second resistive elements 62 also have the length thereof aligned with the Y direction, and the screen printing thereof is performed in the Y direction.

Since the resistive elements 56 and 62 are formed in wider patterns than in the conventional technology, and the screen printing thereof is performed in the longitudinal direction thereof, the resistive material printed by screen printing seeps out from the target area to a smaller degree than in the conventional technology and the variation in the degree of seeping out is small as well. As a result, the variation in the value of resistance of the resistive elements 56 and 62 is small.

Figure 11:
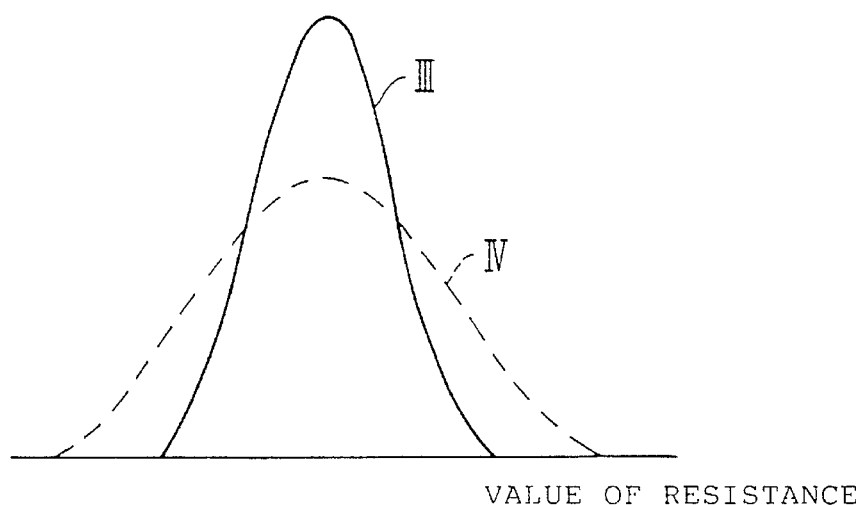
FIG. 11 indicates the distribution of the values of resistance of resistive elements provided in a single sheet.

This is illustrated in FIG. 11, in which the line III indicates the distribution of the values of resistance of the resistive elements 56 provided in each first sheet 51. The line III also indicates the distribution of the values of resistance of the resistive elements 62 provided in each second sheet 52. It will be noted that the distribution indicated by the line III is more focused than the conventional distribution indicated by the line IV in the same figure.

Figure 12:
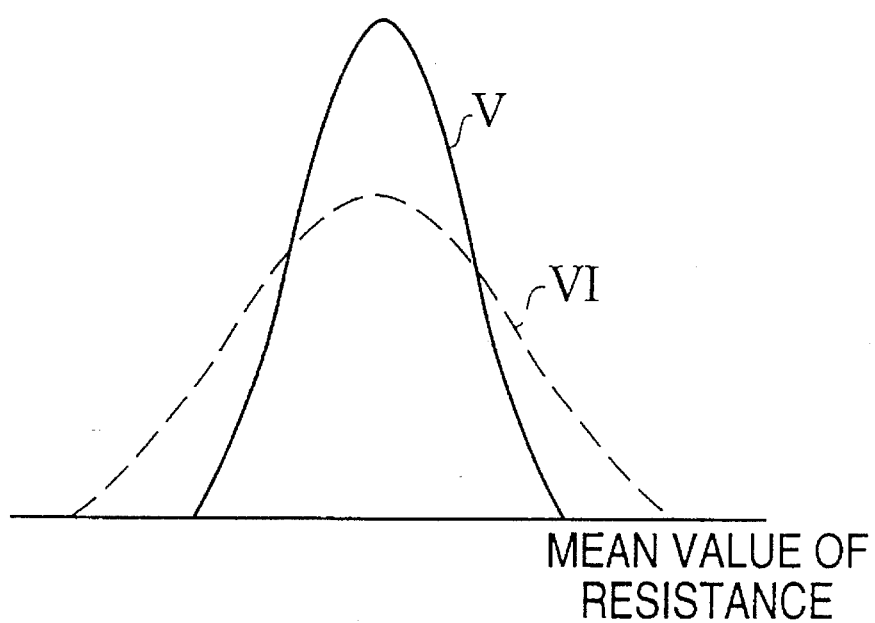
FIG. 12 indicates the distribution of the mean values of resistance of resistive elements respectively provided in a plurality of sheets constituting a lot.

The line V in FIG. 12 indicates the distribution of the mean values of resistance of the resistive elements 56 provided in a plurality of first sheets 51 constituting a lot. The line V also indicates the distribution of the mean values of resistance of the resistive elements 62 provided in a plurality of second sheets 52 constituting a lot. It will be noted that the distribution indicated by the line V is more focused than the conventional distribution indicated by the line VI in the same figure.

Since it becomes possible to control the value of resistance of the resistive elements 56 and 62 as described above with precision, the yield of the first and second sheets 51 and 52 is improved as compared with the conventional technology.

In an alternative way of manufacturing, the printing of the resistive elements 56 and 62 may also be performed in the width direction thereof.

(3) Reduction in C paste consumption

The binder contained in the blended Ag and C paste contains a polyester cross linking agent. After the paste has dried, crosslinks are partially formed.

Hence, the detection lines 55 and the ground scan lines 61 formed of the blended Ag and C paste are less likely to undergo discoloration and migration than those in the conventional technology.

Therefore, as shown in FIG. 8, for the detection lines 55 the detection lines 55 and the ground scan lines 61 remain bare; that is, they are not coated by a carbon overcoat.

The configuration of the present invention has the following advantages over the conventional configuration in which the entirety of the detection lines 55 and of the ground scan lines 61 are coated by the carbon overcoat.

(i) Consumption of C paste in fabricating the first and second sheets 51 and 52 is about 0.2 gr, which is about ⅓ of that in the conventional technology.

(ii) The dection lines 55, as well as the ground scan lines 61, can be arranged closer to each other due to added space that is conventionally occupied by the overcoat which protrudes from the respective detection lines 55 or ground scan lines 61. As noted in FIG. 6, the minimum interval $P_1$ of the detection lines 55 well as the minimum interval $P_2$ of the ground scan lines 61 is small as 1.00 mm in contrast with the conventional interval of 1.25 mm.

(iii) When the entirety of the detection lines 55 is coated, a large number of guide reference points are necessary for the overcoat to be properly laid out. Normally, it takes about twenty-five minutes to align the screen having an overcoat pattern with a sheet provided with the detection lines 55 or ground scan lines 61. In contrast, such an alignment with respect to the detection lines 55 or ground scan lines 61 is not necessary in the present invention. The only alignment necessary concerns the resistive elements and this alignment takes about thirteen minutes, which is about half as long as the time required in the conventional technology. Thus, the man-hours required for the alignment process in the carbon printing process are reduced.

The same advantages as mentioned above can also be obtained by using Ag paste containing polyester binder capable of inducing partial crosslinks instead of blended Ag and C paste containing polyester binder capable of inducing partial crosslinks.

(4) Improvement in abrasion resistance

As shown in FIGS. 7 and 8, the contact main bodies 58 and 64 are respectively coated by the overcoats 59 formed of C paste and the covers 65 formed of C paste.

Hence, the contacts 57 and 63 which are repeatedly hit as the keyboard is operated have excellent abrasion resistance.

Figure 13:
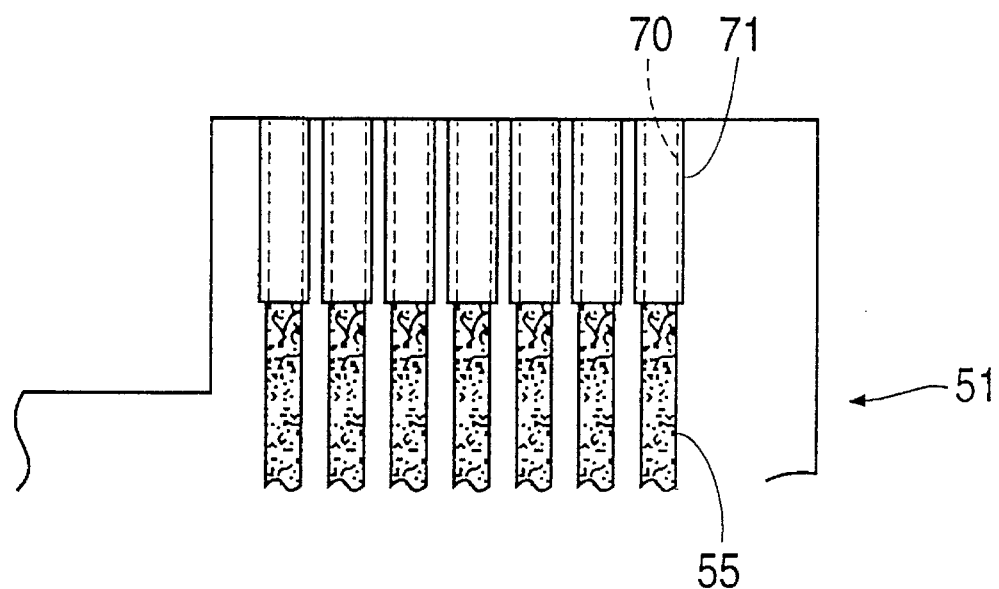
FIG. 13 shows terminals of FIG. 6 at an enlarged scale.

It is further to be noted that, as shown in FIG. 13, terminals 70 at the ends of the detection lines 55 are coated by C paste 71.

The terminals 70 which are connected with metal connectors have excellent abrasion resistance.

In a more preferable embodiment, the width of the resistive elements on the first and second sheets is equal to or greater than 0.4 mm. This is because the screen printing for producing a width smaller than 0.4 mm gives rise to a variation in the value of resistance because there is a likelihood that the blurred or broken printed pattern, or the irregularity in thickness is created. It is to be noted that the variation in the cross section of the resistive elements caused by such a defective printed pattern leads to the variation of the value of resistance of the resistive elements.

Another point to be considered in the fabrication of the first and second sheets is that it is difficult to predict the location at which a point of peculiarity (that is, the point characterized by abnormally high or low value of resistance) is created in a total of 80–140 resistive patterns on a sheet. Also, there is no knowing beforehand whether a point of peculiarity is created on one of the sheets or a plurality of points of peculiarity are created on both of the sheets. Accordingly, it is preferable that the resistive elements have substantially the same length on the first sheet and on the second sheet so that the locations of points of peculiarity show a uniform distribution as much as possible.

Descriptions will now be given of the other embodiments of the present invention.

Figure 14:
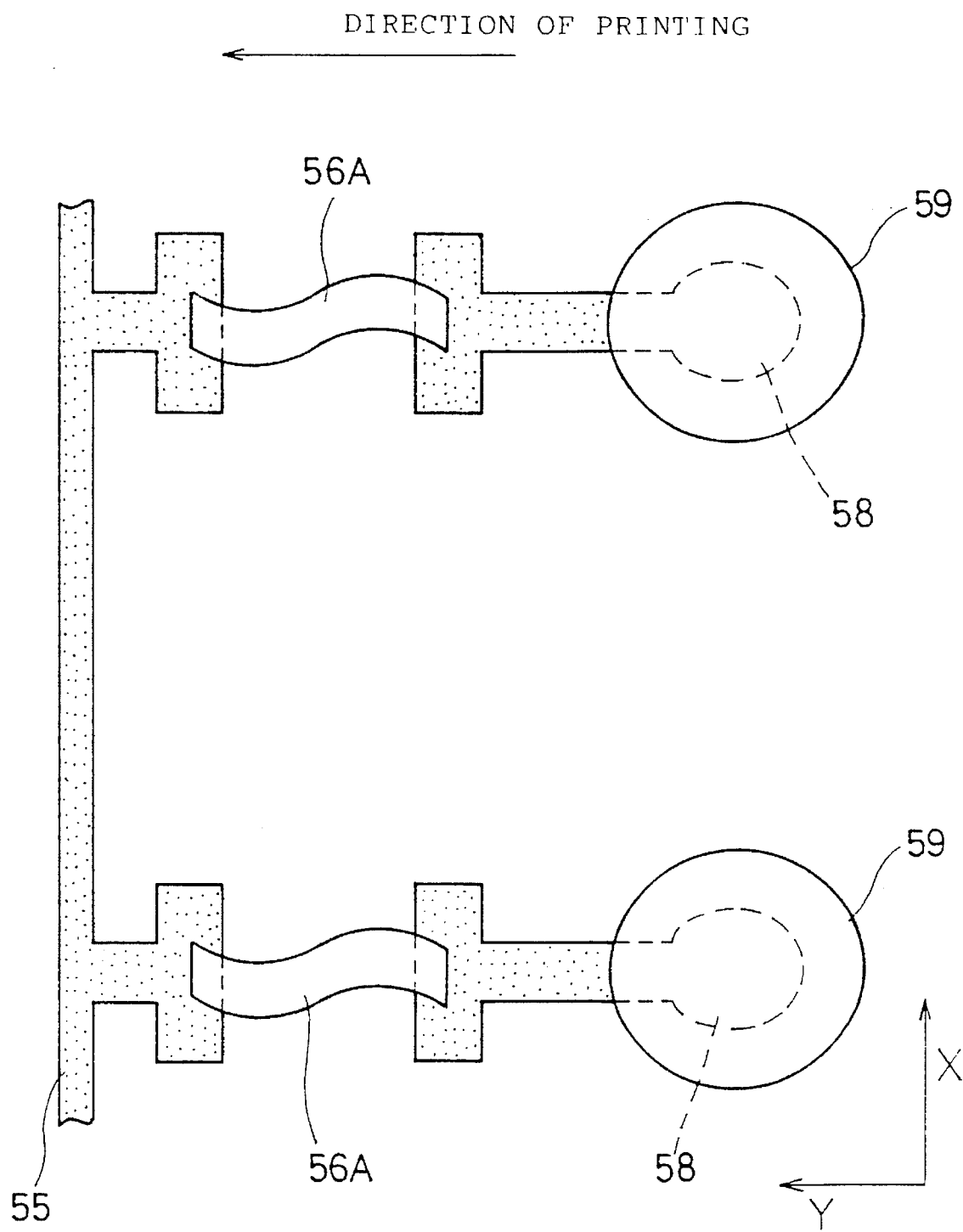
FIG. 14 shows a second embodiment of the present invention.

FIG. 14 shows a second embodiment of the present invention in which first resistive elements 56A are formed in snaking S-shaped patterns.

Figure 15:
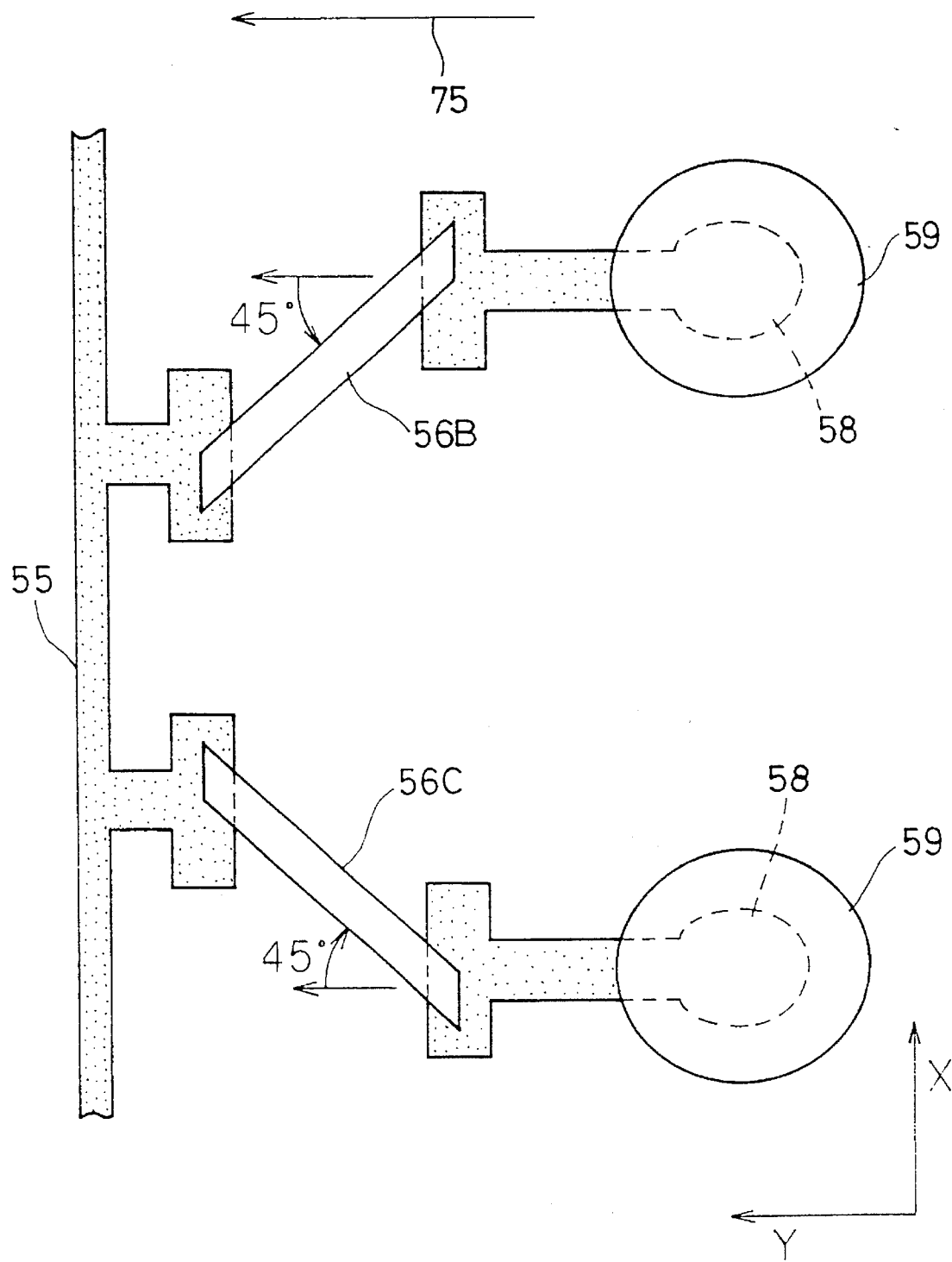
FIG. 15 shows a third embodiment of the present invention.

FIG. 15 shows a third embodiment of the present invention in which a respective first resistive element 56B is formed in a straight pattern inclined 45° counterclockwise with respect to a direction 75 of printing, and in which a different respective first resistive element 56C is formed a straight pattern and is inclined 45° clockwise with respect to the direction 75 of printing.

Figure 16:
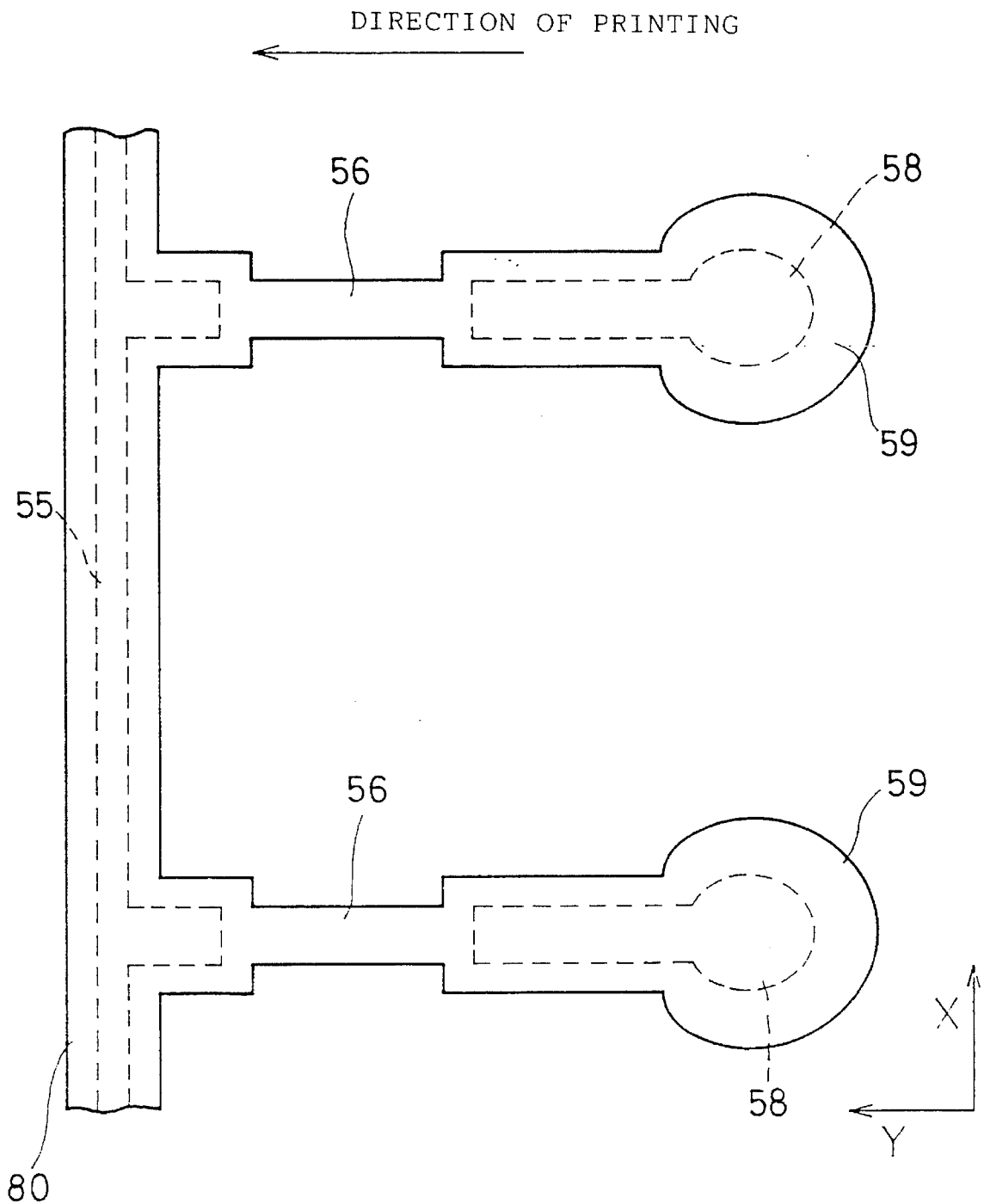
FIG. 16 shows a fourth embodiment of the present invention.

FIG. 16 shows a fourth embodiment of the present invention in which carbon patterns 80 are formed on the detection lines 55 shown in FIG. 8.

Figure 17:
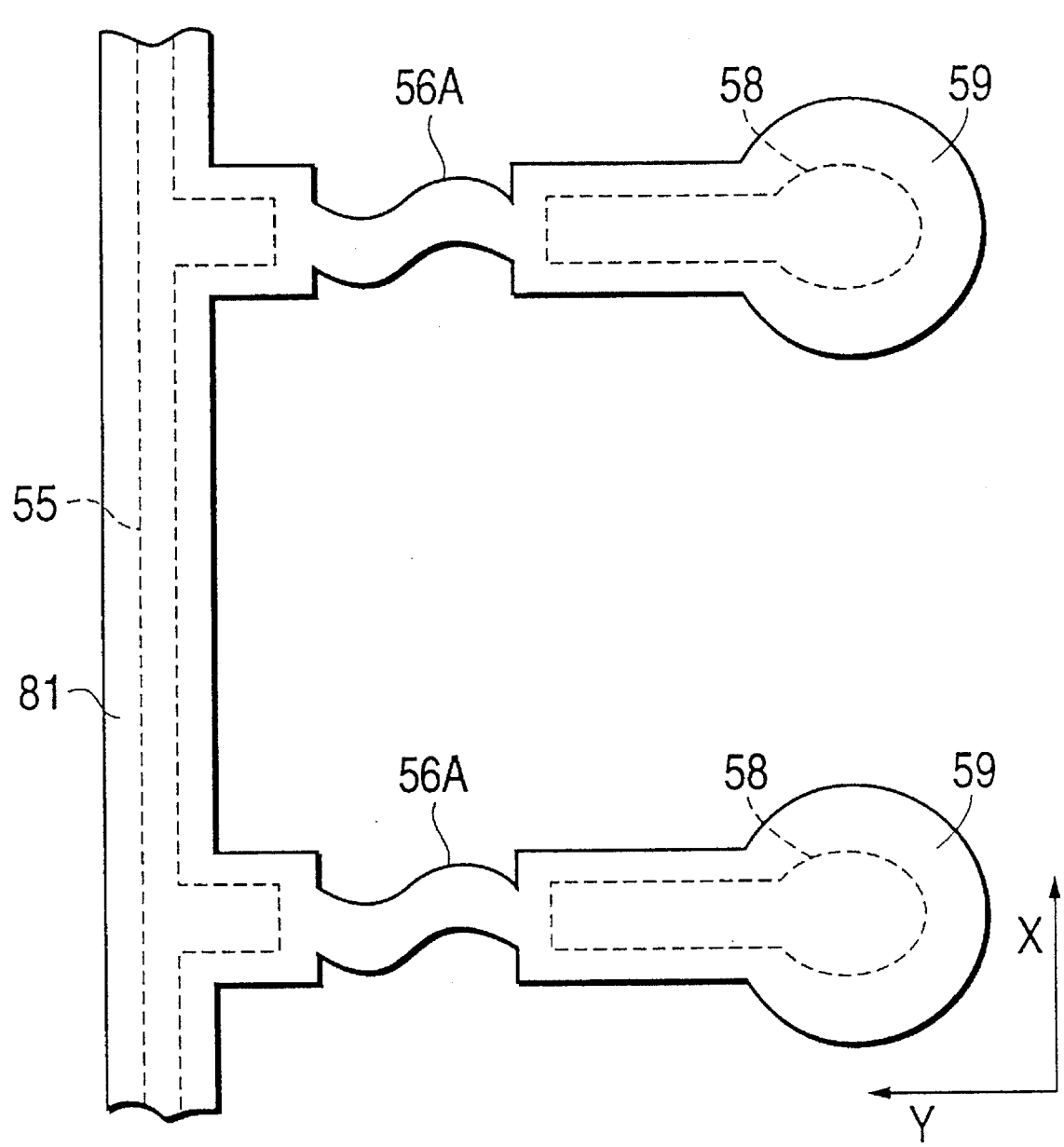
FIG. 17 shows a fifth embodiment of the present invention.

FIG. 17 shows a fifth embodiment of the present invention in which carbon patterns 81 are formed on the detection lines 55 shown in FIG. 14.

Figure 18:
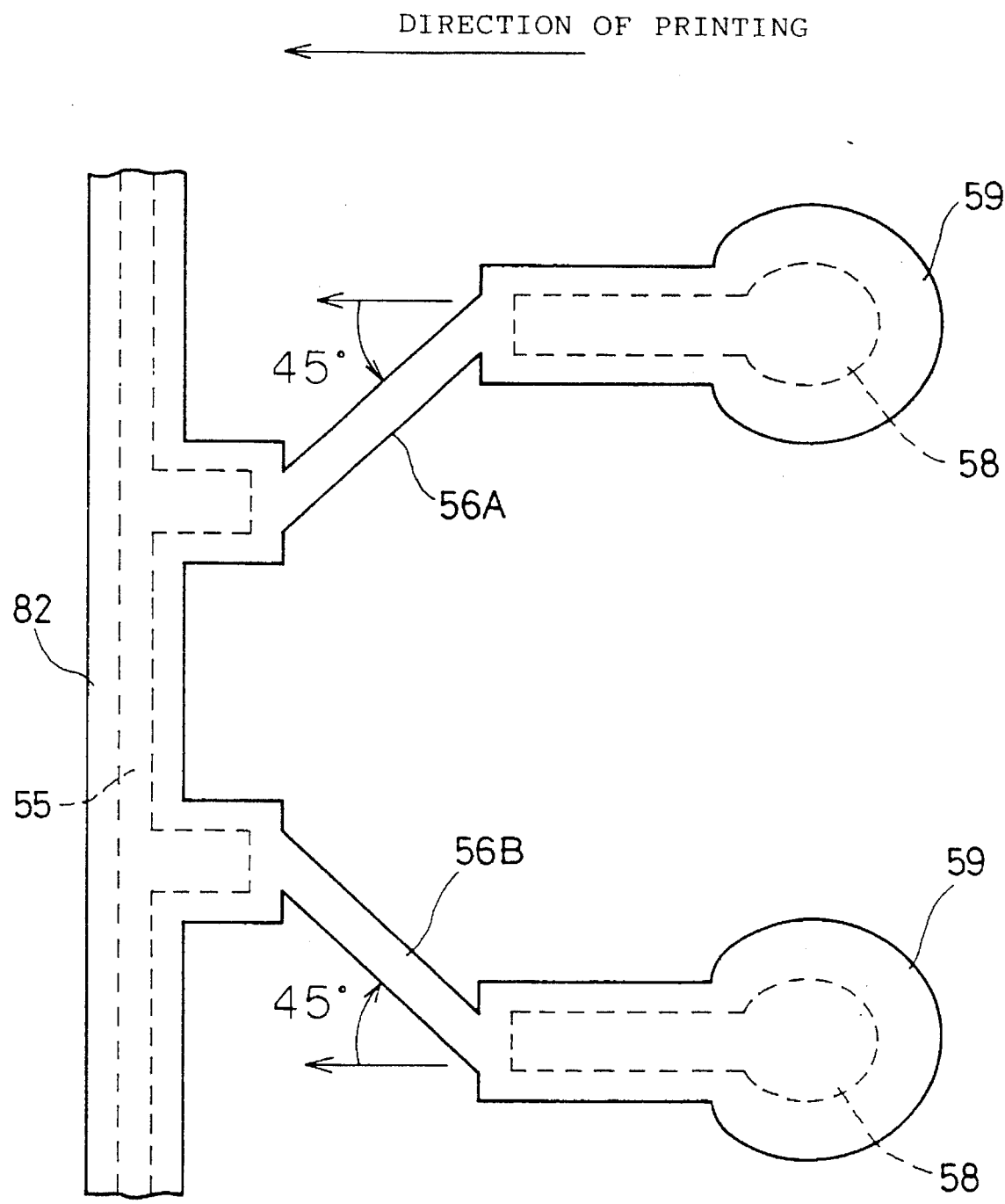
FIG. 18 shows a sixth embodiment of the present invention.

FIG. 18 shows a sixth embodiment of the present invention in which carbon patterns 82 are formed on the detection lines 55 shown in FIG. 15.

As has been described above, the above embodiments of the present invention ensure that the first sheet in which the value of resistance is below the lower limit of the permitted range can be put to use in combination with the second sheet in which the value of resistance is relatively high. That is, sheets that are conventionally discarded as defective products can be put to use, thereby reducing the cost of producing keyboard circuit apparatuses.

The above embodiments of the present invention ensure that the values of resistance of the first resistive elements and/or the second resistive elements are controlled with precision.

The above embodiments of the present invention also ensure that the values of resistance of the first resistive elements and/or the second resistive elements are controlled with precision.

The above embodiments of the present invention also ensure that the values of resistance of the first resistive elements and/or the second resistive elements are controlled with precision.

The above embodiments of the present invention make it possible to have narrower intervals between the detection lines and/or between the ground scan lines than in the case in which the overcoat of carbon pattern is provided on the lines, thus making it possible to effectively reduce the size of the keyboard.

Although it is assumed that the Y lines, that is the lines crossed by the detection lines, are grounded and they have been referred to as ground scan lines throughout the specification, these lines are not necessarily grounded.

The present invention is not limited to the above described embodiments, and variations and modifications may be made without departing from the scope of the present invention.

What is claimed is:

1. A keyboard circuit apparatus comprising:
   a first sheet produced such that a plurality of X lines, first resistive elements connected to the respective X lines and first contacts provided at the ends of said respective first resistive elements are printed on a first sheet main body;
   a second sheet produced such that a plurality of Y lines are crossed by said X lines, a plurality of second resistive elements connected to the respective Y lines and second contacts provided at the ends of said respective second resistive elements are printed on a second sheet main body; and
   an insulating spacer having a plurality of openings,
   wherein said insulating spacer is laid on said first sheet and said second sheet is laid on said insulating spacer so that said first contacts and said second contacts are directly opposite each other respectively at said openings, and
   any one of said first resistive elements and the corresponding one of said second resistive elements are electrically connected in series when the corresponding one of said first contacts and the corresponding one of said second contacts are brought into contact with each other.

2. The keyboard circuit apparatus as claimed in claim 1, wherein said plurality of first resistive elements are formed in straight patterns lying in the same direction.

3. The keyboard circuit apparatus as claimed in claim 2, wherein said plurality of second resistive elements are formed in straight patterns and lie in the same direction.

4. The keyboard circuit apparatus as claimed in claim 1, wherein said plurality of first resistive elements are formed in S-shaped patterns lying in the same direction.

5. The keyboard circuit apparatus as claimed in claim 4, wherein said plurality of second resistive elements are formed in S-shaped patterns and lie in the same direction.

6. The keyboard circuit apparatus as claimed in claim 1, wherein said first sheet is in a plane which is parallel to the direction of printing, said plurality of first resistive elements being formed in straight patterns, each first resistive element being inclined 45° in the plane with respect to the direction of printing.

7. The keyboard circuit apparatus as claimed in claim 6, wherein said second sheet is in a plane which is parallel to the direction of printing, and said plurality of second resistive elements are formed in straight patterns, each second resistive element being inclined 45° in the plane with respect to the direction of printing.

8. The keyboard circuit apparatus as claimed in claim 1, wherein said X lines, said first contacts, said Y lines and said second contacts are printed in bare patterns formed of blended silver-carbon paste containing polyester binder inducing partial crosslinks after the paste has dried.

9. The keyboard circuit apparatus as claimed in claim 1, wherein the width of the first resistive elements printed on said first sheet is equal to or greater than 0.4 mm.

10. The keyboard circuit apparatus as claimed in claim 9, wherein the width of the second resistive elements printed on said second sheet is equal to or greater than 0.4 mm.

11. The keyboard circuit apparatus as claimed in claim 1, wherein the first resistive elements on said first sheet have substantially the same length as the second resistive elements on said second sheet.

12. The keyboard circuit apparatus as claimed in claim 1, wherein said plurality of second resistive elements are formed in straight patterns and lie in the same direction.

13. The keyboard circuit apparatus as claimed in claim 1, wherein said plurality of second resistive elements are formed in S-shaped patterns and lie in the same direction.

14. The keyboard circuit apparatus as claimed in claim 1, wherein said first sheet is in a plane which is parallel to the direction of printing, and said plurality of second resistive elements are formed in straight patterns, each second resistive element being inclined 45° in the plane with respect to the direction of printing.

15. The keyboard circuit apparatus as claimed in claim 1, wherein said X lines, said first contacts, said Y lines and said second contacts are printed in bare patterns formed of carbon paste containing polyester binder inducing partial crosslinks after the paste has dried.

16. The keyboard circuit apparatus as claimed in claim 1, wherein the width of the second resistive elements printed on said second sheet is equal to or greater than 0.4 mm.

17. A keyboard circuit apparatus comprising:
    a first sheet which includes:
       a plurality of X lines, each X line having a plurality of corresponding resistive elements, each resistive element having a first end connected to the corresponding X line and a second end having a contact point thereon;
    a second sheet which includes:
       a plurality of Y lines, each Y line having a plurality of corresponding resistive elements, each resistive element having a first end connected to the corresponding Y line and a second end having a contact point thereon, the contact points on the second ends of the resistive elements of the Y lines respectively corresponding to the contact points on the second ends of the resistive elements of the X lines to define a plurality of pairs of contact points; and
    an insulating spacer layer positioned between the first sheet and the second sheet and having a plurality of openings respectively corresponding to the plurality of pairs of contact points, wherein
       the X lines of the first sheet extend in a first direction and the Y lines of the second sheet extend in a second direction which crosses the first direction,
       the corresponding contact points in each pair of contact points are positioned directly opposite to each other with the corresponding opening of the insulating spacer layer therebetween, and
       contact through the corresponding opening between the contact points of a respective pair of contact points causes the resistive elements of the contacting contact points to be electrically connected in series.

18. The keyboard circuit apparatus as claimed in claim 17, wherein the resistive elements corresponding to the X lines are formed in straight patterns lying in the same direction.

19. The keyboard circuit apparatus as claimed in claim 18, wherein the resistive elements corresponding to the Y lines are formed in straight patterns and lie in the same direction.

20. The keyboard circuit apparatus as claimed in claim 17, wherein the resistive elements corresponding to the X lines are formed in S-shaped patterns lying in the same direction.

21. The keyboard circuit apparatus as claimed in claim 20, wherein the resistive elements corresponding to the Y lines are formed in S-shaped patterns and lie in the same direction.

22. The keyboard circuit apparatus as claimed in claim 17, wherein said first sheet is in a plane which is parallel to the direction of printing, the resistive elements corresponding to the X lines being formed in a straight pattern and inclined 45° in the plane with respect to the direction of printing.

23. The keyboard circuit apparatus as claimed in claim 22, wherein the first sheet is in a plane which is parallel to the direction of printing, and the resistive elements corresponding to the Y lines are formed in straight patterns and are each inclined 45° in the plane with respect to the direction of printing.

24. The keyboard circuit apparatus as claimed in claim 17, wherein the X lines, the contact points of resistive elements corresponding to the X lines, the Y lines and the contact points of resistive elements corresponding to the Y lines are printed in bare patterns formed of blended silver-carbon paste containing polyester binder inducing partial crosslinks after the paste has dried.

25. The keyboard circuit apparatus as claimed in claim 17, wherein the width of each resistive element corresponding to an X line is equal to or greater than 0.4 mm.

26. The keyboard circuit apparatus as claimed in claim 25, wherein the width of each resistive element corresponding to a Y line is equal to or greater than 0.4 mm.

27. The keyboard circuit apparatus as claimed in claim 17, wherein the resistive elements corresponding to the X lines have substantially the same length as the resistive elements corresponding to the Y lines.

28. The keyboard circuit apparatus as claimed in claim 17, wherein the resistive elements corresponding to the Y lines are formed in straight patterns and lie in the same direction.

29. The keyboard circuit apparatus as claimed in claim 17, wherein the resistive elements corresponding to the Y lines are formed in S-shaped patterns and lie in the same direction.

30. The keyboard circuit apparatus as claimed in claim 17, wherein the second sheet is in a plane which is parallel to the direction of printing, and the resistive elements corresponding to the Y lines are formed in straight patterns and are each inclined 45° in the plane with respect to the direction of printing.

31. The keyboard circuit apparatus as claimed in claim 17, wherein the X lines, the contact points of the resistive elements corresponding to the X lines, the Y lines and the contact points of the resistive elements corresponding to the Y lines are printed in bare patterns formed of carbon paste containing polyester binder inducing partial crosslinks after the paste has dried.

32. The keyboard circuit apparatus as claimed in claim 17, wherein the width of each resistive element corresponding to a Y line is equal to or greater than 0.4 mm.

\* \* \* \* \*

UNITED STATES PATENT AND TRADEMARK OFFICE
CERTIFICATE OF CORRECTION

PATENT NO. : 5,514,842
DATED : May 7, 1996
INVENTOR(S) : Takeshi SUGII, et al.

It is certified that error appears in the above-indentified patent and that said Letters Patent is hereby corrected as shown below:

Column 7, line 15, after "FIG. 8", delete the comma (",");
    Line 15, after "55", insert a comma (",");
    Line 26, delete "dection" and insert therefor --detection--.

Column 8, line 28, after "formed", insert --in--.

Signed and Sealed this

Twenty-seventh Day of August, 1996

Attest:

BRUCE LEHMAN

*Attesting Officer*     *Commissioner of Patents and Trademarks*